(12) United States Patent
Terabe et al.

(10) Patent No.: US 9,627,499 B2
(45) Date of Patent: Apr. 18, 2017

(54) ELECTRICAL CONDUCTION ELEMENT, ELECTRONIC DEVICE, AND METHOD FOR OPERATING ELECTRICAL CONDUCTION ELEMENT

(71) Applicant: National Institute for Materials Science, Tsukuba-shi, Ibaraki (JP)

(72) Inventors: Kazuya Terabe, Tsukuba (JP); Takashi Tsuchiya, Tsukuba (JP); Masakazu Aono, Tsukuba (JP)

(73) Assignee: National Institute for Materials Science, Tsukuba-shi, Ibaraki (JP)

( * ) Notice: Subject to any disclaimer, the term of this patent is extended or adjusted under 35 U.S.C. 154(b) by 0 days.

(21) Appl. No.: 15/034,204

(22) PCT Filed: Oct. 31, 2014

(86) PCT No.: PCT/JP2014/079047
§ 371 (c)(1),
(2) Date: May 4, 2016

(87) PCT Pub. No.: WO2015/068651
PCT Pub. Date: May 14, 2015

(65) Prior Publication Data
US 2016/0276453 A1 Sep. 22, 2016

(30) Foreign Application Priority Data
Nov. 11, 2013 (JP) .................................. 2013-233226

(51) Int. Cl.
*H01L 29/49* (2006.01)
*H01L 29/786* (2006.01)
(Continued)

(52) U.S. Cl.
CPC ...... *H01L 29/4908* (2013.01); *H01L 29/1606* (2013.01); *H01L 29/778* (2013.01); *H01L 29/78684* (2013.01); *H01L 51/0591* (2013.01)

(58) Field of Classification Search
None
See application file for complete search history.

(56) References Cited

U.S. PATENT DOCUMENTS 8,492,747 B2 * 7/2013 Choi ................. H01L 29/78684
257/213
8,617,941 B2 * 12/2013 Farmer ............... H01L 29/1606
257/27

(Continued)

FOREIGN PATENT DOCUMENTS

JP A-2010-199215 9/2010
JP 2012-069612 A 4/2012

(Continued)

OTHER PUBLICATIONS

H. Min, et al., "Ab initio theory of gate induced gaps in graphene bilayers," Phys. Rev. B75, (2007) 155115.

(Continued)

*Primary Examiner* — Jeffrey Zweizig
(74) *Attorney, Agent, or Firm* — Drinker Biddle & Reath LLP

(57) ABSTRACT

A nonvolatile three-terminal element is provided that operates by controlling a bandgap in an electron state of a graphene-based material. An ion conductor (5) having hydrogen ion or oxygen ion conductivity is provided between graphene oxide or graphene (hereinafter, referred to as GO) (6), and a gate electrode (1). In addition, a drain electrode (2) and a source electrode (3) are provided on a GO (6) side.

15 Claims, 8 Drawing Sheets

(51) Int. Cl.
*H01L 51/05* (2006.01)
*H01L 29/778* (2006.01)
*H01L 29/16* (2006.01)

(56) References Cited

U.S. PATENT DOCUMENTS

| | | |
|---|---|---|
| 2010/0213435 A1 | 8/2010 | Fujii et al. |
| 2012/0132893 A1 | 5/2012 | Heo et al. |
| 2012/0205606 A1 | 8/2012 | Lee et al. |
| 2013/0092904 A1 | 4/2013 | Ushikura |
| 2013/0140648 A1 | 6/2013 | Hasegawa et al. |

FOREIGN PATENT DOCUMENTS

| | | |
|---|---|---|
| JP | A-2012-119665 | 6/2012 |
| JP | A-2012-138451 | 7/2012 |
| JP | A-2013-084845 | 5/2013 |

OTHER PUBLICATIONS

Y. W. Son, et al., "Energy Gaps in Graphene Nanoribbons," Phys. Rev. Lett., 97 (2006) 216803.

R. Balog, et al., "Bandgap opening in graphene induced by patterned hydrogen adsorption," Nature Mater., 9 (2010) 315.

Yasumichi Matsumoto, "Properties of Graphene Oxide and Its Application to the Electrodes," GS Yuasa Technical Report, 9 (2012), p. 1-6.

B. Scherrer, et al., "On Proton Conductivity in Porous and Dense Yttria Stabilized Zirconia at Low Temperature," Advanced Functional Materials, 23, (2013) 1957-1964.

Shimadzu Application News, "Measurements of Bandgap for Compound Semiconductors," Spectrophotometric Analysis No. A428, 2010.

Mathkar, A., et al., "Controlled, Stepwise Reduction and Band Gap Manipulation of Graphene Oxide," J. Phys. Chem. Lett. 2012, 3, 986-991.

Insung Kim, et al., "Low temperature solution-processed graphene oxide/$Pr_{0.7}CA_{0.3}MnO_3$ based resistive-memory device," Applied Physics Letters, vol. 99, Jul. 25, 2011, pp. 042101-1-042101-3.

International Search Report mailed Jan. 20, 2015 for PCT/JP2014/079047.

Japanese Office Action (with attached English-language translation) dated Oct. 4, 2016 that issued in Japanese patent application No. 2015-546624.

Notice of Allowance with English Language Language Translation dated Feb. 14, 2017, issued in JP patent application No. 2015-546624 (6 pages).

* cited by examiner

ELECTRICAL CONDUCTION ELEMENT, ELECTRONIC DEVICE, AND METHOD FOR OPERATING ELECTRICAL CONDUCTION ELEMENT

TECHNICAL FIELD

The present invention relates to an electrical conduction element that operates by allowing an electrochemical reaction to occur through migration of hydrogen ions or oxygen ions in a solid so as to control a bandgap and electrical resistance of graphene and graphene oxide (GO), an electronic device that uses the electrical conduction element, and a method for operating the electrical conduction element.

Priority is claimed on Japanese Patent Application No. 2013-233226, filed Nov. 11, 2013, the content of which is incorporated herein by reference.

BACKGROUND ART

A graphene-based material such as graphene and graphene oxide, which is a derivative of graphene, has been expected as a material capable of realizing a new function or a new performance which cannot be obtained in a semiconductor material, which is represented by silicon, in the related art. Graphene represents a material that corresponds to one layer of graphite that has a layer-shaped structure of carbon atoms, and a derivative in which oxygen atoms are coupled to the graphene is referred to as graphene oxide. Such a graphene-based material is a very thin two-dimensional material, and thus it is possible to construct a switching device of an ultrathin conduction channel, and the like which cannot be obtained in a silicon semiconductor transistor of the related art. In addition, such a graphene-based material exhibits unique characteristics such as very high electron mobility and a very high quantum Hall effect, and thus the graphene-based material has attracted attention as a material of various electronic devices such as a high-frequency transistor and a quantum device.

It is necessary to control electrical characteristics of a material so as to realize an electronic device such as a switching device by using the graphene-based material. To achieve this, it is preferable to control a bandgap in an electron state of the graphene-based material. However, graphene has metal characteristics, and thus there is a problem in that graphene has no bandgap. As means for solving the problem, a method of applying an electric field that is vertical to a layer surface direction of a two-layer graphene film, a method of thinning single-phase graphene, a method of adsorbing hydrogen atoms to a graphene surface, a method of using graphene oxide, and the like (refer to NPL 1, NPL 2, NPL 3, and NPL 4) have been suggested.

In the method of applying the vertical electric field, when application of a voltage is stopped, formation of the bandgap is also stopped. According to this, a device function such as switching is volatile. The thinning method, the method of adsorbing hydrogen atoms, and the method of using the graphene oxide can constantly form a bandgap. However, in a case of being applied as a material of an electronic device such as a field effect transistor, the function such as switching is a volatile function that disappears when stopping application of an external voltage for control. The volatility becomes a problem in application to an electronic device such as a nonvolatile memory which is required to continuously exhibit functionality even when stopping application of a voltage.

CITATION LIST

Non-Patent Literature

[NPL 1] H. Min, B. R. Sahu, S. Banerjee, and A. H. MacDonald, Phys. Rev. B, 75(2007)155115.

[NPL 2] Y. W. Son, M. L. Cohen, and S. G Louie, Phys. Rev. Lett., 97(2006)216803.

[NPL 3] R. Balog, B. Jorgensen, L. Nilsson, M. Andersen, E. Rienks, M. Bianchi, M. Fanetti, E. Lagsgaard, A. Baraldi, S. Lizzit, Z. Sljivancanin, F. Besenbacher, B. Hammer, T. G. Pedersen, P. Hofmann and L. Hornekar, Nature Mater., 9(2010)315.

[NPL 4] Yasumichi Matsumoto, G S Yuasa Technical Reportz 9(2012)1-6.

[NPL 5] B. Scherrer, M. Schlupp, D. Stender, J. Martynczuk, J. Grolig, H. M a, P. Kocher, T. Lippert, M. Prestat, and L. Gauckler, Advanced Functional Materials, 23, (2013) 1957-1964.

[NPL 6] Shimadzu application news, No. 428 (2010), Shimadzu Analysis and Measurement Department

[NPL 7] Mathkar, A.; Tozier, D.; Cox, P.; Ong, P.; Galande, C.; Balakrishnan, K.; Reddy, A. L. M.; Ajayan, P. M. J. Phys. Chem. Lett.2012, 3, 986-991.

SUMMARY OF INVENTION

Technical Problem

An object of the invention is to provide an all-solid type element which is capable of allowing electrical resistance to vary through control of a bandgap in an electron state of graphene and graphene oxide by using an ion conductor material in which hydrogen ion ($H^+$, also referred to as a proton) or oxygen ion ($O^{-2}$, also referred to as an oxide ion) migrate at the inside of a solid, and in which the control of the bandgap and the variation of the electrical resistance are nonvolatile.

Solution to Problem

According to an aspect of an embodiment of the invention, an electrical conduction element is provided, including: an ion conductor material layer including an ion conductor capable of conducting a hydrogen ion or an oxygen ion; a gate electrode layer and a graphene-based material layer between which the ion conductor material layer is interposed, the graphene-based material layer including graphene oxide or graphene which is laminated on an insulating substrate; and a drain electrode layer and a source electrode layer which are provided on a surface of the graphene-based material layer or in the interlayer position of the graphene-based material layers, or on the insulating substrate.

Here, a buffer layer is provided between the drain electrode layer and the ion conductor material layer and between the source electrode layer and the ion conductor material layer.

In addition, the electrical conduction element may further include means that applies a voltage between the gate electrode layer and the source electrode layer or the between the gate electrode layer and drain electrode layer. The electrical conduction element is arranged so that a hydrogen ion or an oxygen ion in the ion conductor material layer migrates due to the application of a voltage by the means to cause an electrochemical reaction to occur at an interface between the graphene-based material layer and the ion conductor material layer, allowing the oxygen atom to be released from the graphene-based material layer allowing the oxygen atom to be provided to the graphene-based material layer. In addition, the oxygen atom may be released from the graphene-based material layer, or the oxygen atom may be applied to the graphene-based material layer.

In addition, the electrical conduction element is arranged so that a magnitude of a bandgap that is an electron state of the graphene-based material layer varies due to the release or provision of the oxygen atom in accordance with the electrochemical reaction, which causes conductivity between the drain electrode and the source electrode to vary.

In addition, the ion conductor material may contains a metal oxide or a polymer compound which has a hydrogen ion.

In addition, the metal oxide may be selected from the group consisting of yttrium-stabilized zirconia ($Zr_{1-x}Y_xO_{2-x/2}$ ($0<x\leq0.2$)) and $BaZr_{0.8}Y_{0.2}O_{3-x}$ ($0<x\leq0.2$).

In addition, the polymer compound may be a polymer compound having proton conductivity, particularly, Nation (registered trademark).

In addition, the ion conductor material may contain an oxygen ion.

In addition, the metal oxide may include at least one selected from the group consisting of gadolinium-doped ceria ($Ce_{1-x}G_xO_{2-x/2}$ ($0<x\leq0.5$)) having an oxygen ion, stabilized zirconia, stabilized bismuth oxide, tungsten oxide, zinc oxide, and tin oxide.

In addition, the gate electrode, the source electrode, and the drain electrode may respectively contain at least one selected from the group consisting of platinum, palladium, rhodium, and ruthenium.

In addition, the buffer layer may contain at least one selected from the group consisting of tantalum oxide, aluminum oxide, hafnium oxide, and zirconium oxide.

In addition, a material of the insulator or semiconductor may include at least one selected from the group consisting of metal oxides such as strontium titanate, silicon oxide, and aluminum oxide.

According to another aspect of the embodiment of the invention, an electronic device including the electrical conduction element according to the aspect is provided.

According to still another aspect of the embodiment of the invention, a method for operating an electrical conduction element is provided. The method includes: a first step of applying a voltage to the gate electrode layer of the electrical conduction element according to the aspect to allow a bandgap of the graphene-based material layer to vary in a nonvolatile manner; and a second step of then applying a voltage to the gate electrode layer, the voltage having a range of magnitude that does not vary the bandgap so as to allow the gate electrode layer to perform a volatile operation.

Here, the method may further include after the first step, a third step of applying a voltage to the gate electrode layer so as to allow the bandgap of the graphene-based material layer to vary again in a nonvolatile manlier.

Advantageous Effects of Invention

According to the invention, release or application of oxygen atoms in the graphene oxide or graphene occurs due to application of a voltage to the gate electrode, and due to this effect, it is possible to allow a bandgap in an electron state of the graphene oxide or graphene to vary, and it is possible to allow electrical resistance between the drain electrode and the source electrode, which are constructed on a surface of the graphene oxide or graphene, to vary. The release or application of the oxygen atoms from or to the graphene oxide or graphene hardly occurs when a voltage is not applied. Accordingly, even when not having a specific configuration, the element of the invention can perform a nonvolatile operation. In addition, it is possible to realize an element which is an all-solid type structure compatible with an electronic element of the related art, and which is excellent in durability. In addition, an electrolytic solution is not used. Accordingly, there is no problem such as freezing, evaporation, and boiling of the electrolytic solution at a low temperature or a high temperature, and thus there is an advantage in a case of operation in a wide temperature range.

DESCRIPTION OF EMBODIMENTS

[Structure of Element]

Figure 1A:
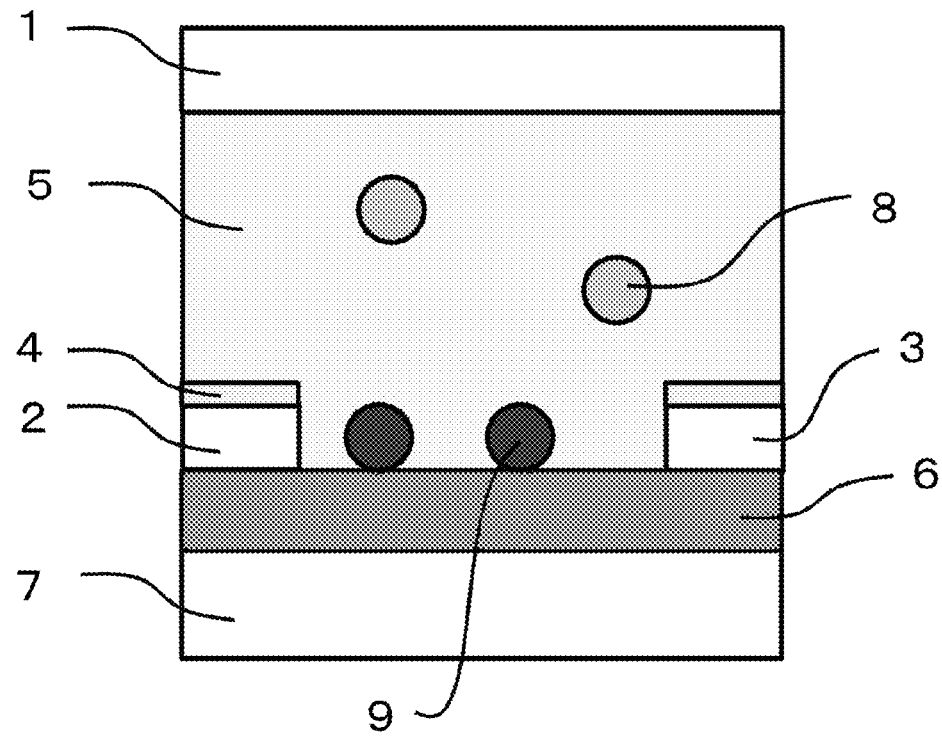
FIG. 1A is a diagram conceptually illustrating a structure of a three-terminal type element that controls a bandgap and electrical conduction characteristics according to an embodiment of the invention.

According to an embodiment of the invention, an element of the embodiment has a three-terminal electrode structure. As illustrated in FIG. 1A as a conceptual diagram, the present element includes an ion conductor material layer including an ion conductor 5 through which a hydrogen ion or an oxygen ion 8 can migrate, and has a stacked structure in which the ion conductor material layer (ion conductor 5) is interposed between a gate electrode 1, and a graphene oxide or graphene-based material layer including graphene oxide or graphene 6 which is coated on an insulating substrate 7.

A drain electrode 2 and a source electrode 3 are formed on a surface of the graphene-based material layer (graphene oxide or graphene 6) to which an oxygen atom 9 is coupled, and buffer layers 4 are formed between (the drain electrode 2 and the ion conductor 5, and between the source electrode 3 and the ion conductor 5). As illustrated in FIG. 1 B, $Sp^2$ coupling regions to which an oxygen atoms are not coupled, and $Sp^3$ coupling regions to which an oxygen atoms are coupled are present in the graphene oxide. $Sp^2$ coupling regions exhibits metallic electrical conductivity, and $Sp^3$ coupling regions exhibits semiconducting or insulating electrical conductivity.

In addition, FIG. 1A and the subsequent conceptual views conceptually illustrate a structure of the three-terminal element according to this embodiment, or an element structure that is drawn to investigate characteristics of the element. Accordingly, it is not necessary for an actual structure to be completely the same as the structure illustrated in the drawings, and elements which are not illustrated in the drawings may be added, or substitution with equivalent elements may be made. For example, in FIG. 1A, an interval between the gate electrode 1 and the drain electrode 2, and an interval between the gate electrode 1 and the source electrode 3 are drawn to be the same as each other. However, the intervals may be different from each other as necessary. In addition, the drain electrode 2 and the source electrode 3 are provided on a surface of the graphene oxide or graphene 6, but may be provided between the graphene oxide or graphene 6 and the insulating substrate 7 as necessary. In addition, in a case of using a multi-layered graphene oxide or graphene 6, the drain electrode 2 and the source electrode 3 may be formed between layers of the multi-layered graphene oxide or graphene 6.

As the ion conductor 5 having hydrogen ion conductivity, various compounds capable of conducting hydrogen ions can be used. For example, in this embodiment, yttrium-stabilized zirconia ($Zr_{1-x}Y_xO_{2-x/2}(0<x\leq0.2)$) can be used. In $Zr_{1-x}Y_xO_{2-x/2}$, it is known that hydrogen ions (proton) migrate at the inside of a solid thereof in a range of approximately 475 K to approximately room temperature (NPL 5). It is preferable that the thickness of the ion conductor 5 be approximately 5 nm to 1000 nm, and more preferably in a range of 10 nm to 100 nm. In addition, for example, $BaZr_{0.8}Y_{0.2}O_{3-x}(0<x\leq0.2)$, a polymer ion-exchange membrane of a vinyl fluoride-based polymer bound with a complex containing perfluorosulfonic acid, a proton conductive polymer compound such as Nafion (registered trademark of E. I. du Pont de Nemours and Company) can also be used. A proton conductive polymer compound such as Nafion known in the related art is a material in which a large amount of water molecules are trapped into a structure. However, leakage of a liquid such as an electrolytic solution or wet gel does not occur. Accordingly, even when the polymer compound is regarded as a solid, there is no problem at all.

As a material of the ion conductor 5 having oxygen ion conductivity, various compounds capable of conducting an oxygen ion can be used, and for example, gadolinium-doped ceria ($Ce_{1-x}Gd_xO_{2-x/2}(0<x\leq0.5)$) having oxygen ion conductivity can be used. It is preferable that the thickness of the ion conductor 5 be approximately 5 nm to 1000 nm, and more preferably in a range of 10 nm to 100 nm. Here, the amount of oxygen defects is determined by a compositional ratio between Gd and Ce. In the chemical formula, it is preferable that x be set to 0.1 to 0.3 in consideration of the amount of the oxygen defects. As the material of the ion conductor, a material other than $Ce_{1-x}Gd_xO_{2-x/2}$ may be used, and specifically, metal oxides such as stabilized zirconia, stabilized bismuth oxide, tungsten oxide having an oxygen defect, zinc oxide, and tin oxide can be used. In addition, various additives other than the metal oxides may be added to the ion conductor. For example, with regard to gadolinium-doped ceria, it can be considered that gadolinium is added to ceria, in which the amount of oxygen defects is small, so as to increase the oxygen defects.

In addition, as the gate electrode 1, the drain electrode 2, or the source electrode 3, various metals can be used, and particularly, platinum (Pt) can be used. It is preferable that the thickness of the electrodes be approximately 10 nm to 100 nm, and more preferably in a range of 10 nm to 30 nm. A metal other than Pt can be selected as the gate electrode 1, the drain electrode 2, or the source electrode 3. Specific examples thereof include noble metals which are metals selected from platinum, gold, palladium, rhodium, ruthenium, alloys of parts thereof, and the like, and which have high chemical stability. In addition, as the buffer layer 4, for example, tantalum oxide ($Ta_2O_5$) can be used. It is preferable that the thickness of the buffer layer be approximately 0.1 nm to 10 nm, and more preferably in a range of 1 nm to 5 nm. A material other than tantalum oxide may be selected as the buffer layer. Specifically, aluminum oxide, hafnium oxide, zirconium oxide, and the like can be used.

Figure 1B:
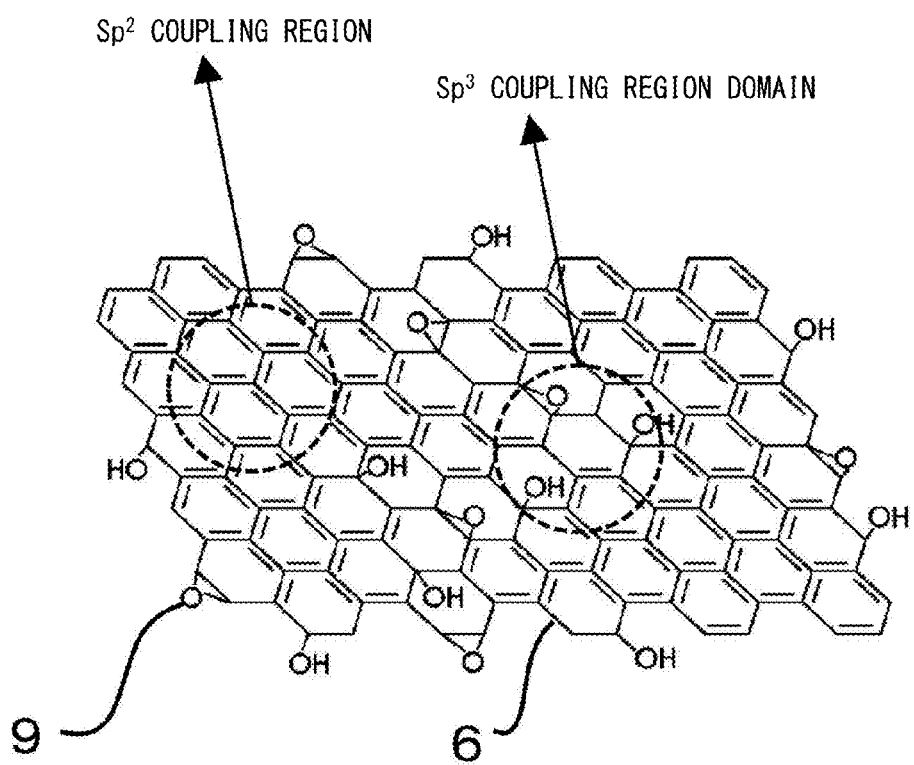
FIG. 1B is a diagram illustrating a crystal structure of graphene oxide.

As a material of the graphene oxide or graphene 6 that is included in the graphene-based material layer, not only single-layered graphene oxide or graphene, but also a material obtained by stacking at least one of the graphene oxide and graphene in a multi-layer can be used. In addition, the amount (represented by an atomic ratio (%) of oxygen/ (oxygen+carbon)) of oxygen contained in the graphene oxide is 0% to 50% on the basis of the total atomic ratio (100%) of graphene oxide, and preferably in a range of approximately 5% to 50%. In addition, as illustrated in FIG. 1B, in the graphene oxide, an $Sp^2$ coupling regions to which an oxygen atoms are not coupled, and an $Sp^3$ coupling regions to which an oxygen atoms are coupled may be mixed in, and oxygen atoms may be coupled to other atoms such as hydrogen.

In addition, here, the "graphene-based material layer" and "graphene" in the element of this embodiment include not only graphene that is not coupled to other elements, but also a material including graphene oxide or graphene in which the amount of oxygen contained is relatively lower or oxygen is not present. It should be understood that the "graphene oxide or graphene" does not represent that only one of graphene oxide and graphene is used, or the amount of oxygen contained is specific and fixed when considering a configuration of a specific element according to this embodiment. For example, even when using graphene at the time of preparing the element, in a case where the element is allowed to operate and oxygen atoms are applied to graphene, graphene becomes graphene oxide, and the contrary is also possible. In addition, application and release of oxygen atoms during operation of the element can occur at any time, and thus the amount of oxygen contained in graphene oxide varies in accordance with the application and release. Accordingly, it should be understood that the "graphene oxide or graphene" in this specification may be any of "graphene oxide" and "graphene" or may dynamically vary between both graphene oxide and graphene, and "graphene oxide or graphene" may be the same as each other from the viewpoint of graphene oxide, or represents a material in which the amount of oxygen contained may dynamically vary.

As a material of the insulating substrate 7, a metal compound such as a metal oxide is preferable, and specific examples thereof include strontium titanate, silicon oxide, aluminum oxide, and the like.

[Operation of Electrical Conduction Element Capable of Allowing Bandgap and Electrical Resistance to Vary]

Figure 2:
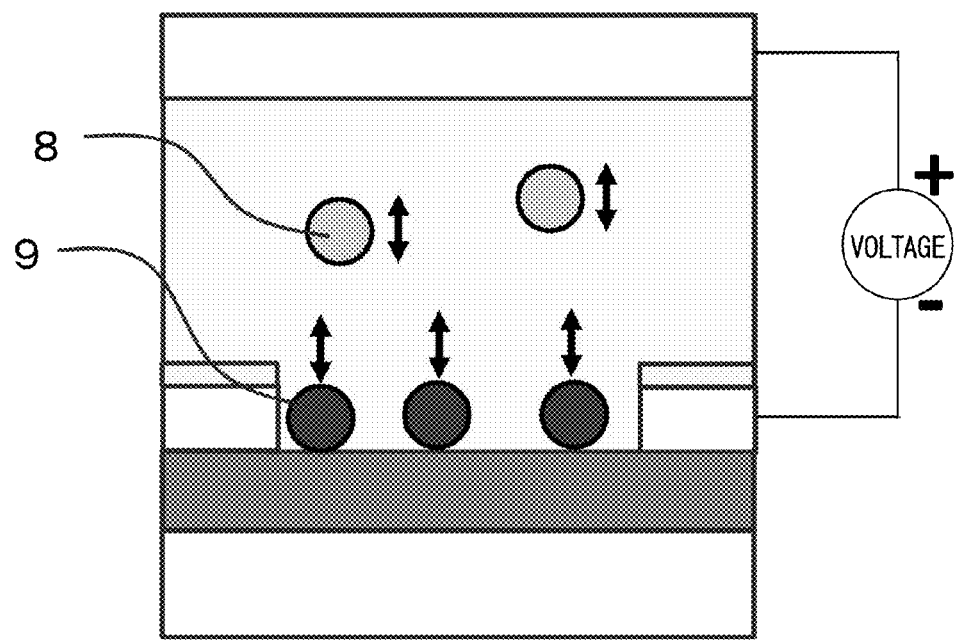
FIG. 2 is a diagram illustrating a principle of occurrence of release or application of oxygen atom in the graphene oxide or graphene due to migration of hydrogen ion or oxygen ion in an ion conductor material.

Description will be given of an operation of the electrical conduction element of this embodiment in which an ion conductor having hydrogen ion or oxygen ion conductivity is used, and is capable of being dynamically set with reference to FIG. 2. FIG. 2 illustrates that the three-terminal element illustrated in FIG. 1A can enter a transitional state by applying a voltage between the gate electrode 1 and the source electrode 3, and between the drain electrode 2 and the source electrode 3.

In a state of the as-prepared element, as illustrated in FIG. 1A, a hydrogen ion or oxygen ion 8 is approximately uniformly distributed in the ion conductor 5. Next, as illustrated in FIG. 2, when applying a voltage (hereinafter, referred to as $V_{gs}$, and a voltage on a gate electrode side is set to polarity of an application voltage with respect to the element. That is, a positive voltage in this case), in which the gate electrode 1 is set as a positive polarity, between the gate electrode 1 and the source electrode 3 in the element in a installation (as-prepared) state of the electrical conduction element, a charged ion in the ion conductor 5 approaches or is distant from the vicinity of an interface (hereinafter, referred to as an interface on a graphene oxide or graphene side. In addition, an interface between the ion conductor and the gate voltage 1 is referred to as an interface on a gate electrode side) between the ion conductor 5 and the graphene oxide or graphene 6 in accordance with the polarity thereof. That is, when applying positive-polarity $V_{gs}$, a hydrogen ion having a positive polarity approaches the interface on the graphene oxide or graphene side, and an oxygen ion having a negative polarity is distant from the interface on the graphene oxide or graphene side. $V_{gs}$ varies in accordance with ion conductivity of a hydrogen ion or an oxygen ion in a solid electrolyte. However, it is preferable that $V_{gs}$ be approximately 0.5 V to 10 V when considering practical use, more preferably approximately 2 V to 3 V, and still more preferably approximately 3 V. Application time is preferably approximately 100 nanoseconds to 100 seconds.

First, description will be given of an operation of the element using the ion conductor 5 that contains hydrogen ions having a positive polarity. Here, in a case where the hydrogen ions are allowed to approach the interface on the graphene oxide or graphene side through application of the positive-polarity $V_{gs}$, an electrochemical reaction ($2H^+ + O^{2-} \rightarrow H_2O$) occurs between the hydrogen ion and an oxygen atom contained in the graphene oxide or graphene, and thus the oxygen atom is released from the graphene oxide or graphene. On the other hand, in a case of applying negative-polarity $V_{gs}$, oxygen atoms are applied to the graphene oxide or graphene due to an electrochemical reaction ($2H^+ + O^{2-} \rightarrow H_2O$) of water that is contained in the ion conductor 5.

Next, description will be given of an operation of the element using the ion conductor 5 that contains oxygen ions having a negative polarity. Here, in a case where the oxygen ions are distant from the interface on the graphene oxide or graphene side through application of positive-polarity $V_{gs}$, oxygen atoms which are contained in the graphene oxide or graphene are also released due to the electrochemical reaction and migration into the ion conductor 5 in accordance with the electrochemical reaction. On the other hand, in a case where the oxygen ions are allowed to migrate to the interface on the graphene oxide or graphene side through application of negative-polarity $V_{gs}$, the oxygen atoms are applied to the graphene oxide or graphene due to the electrochemical reaction (oxidation reaction of the graphene oxide or graphene). In addition, in an element that uses an oxygen ion conductor, water is not necessary for an operation of the element, and thus a countermeasure for release of water from the element is not necessary even in a high-temperature or vacuum environment.

In this element, the bandgap in an electron state or the electrical resistance of the graphene oxide or graphene 6 is controlled by releasing or applying the oxygen atom 9, which is coupled to the graphene oxide or graphene 6, through migration of the hydrogen ion or oxygen ion 8 in the ion conductor 5.

In a method for operating the electrical conduction element of this embodiment, for example, a voltage is applied to the gate electrode 1 to allow the bandgap of the graphene-based material layer to vary in a nonvolatile manner (first step). Here, the nonvolatile variation represents a variation in which a variation in the bandgap due to application of a voltage is not eliminated even when stopping application of an external voltage. Next, a voltage having a magnitude in a range in which the bandgap does not vary is applied to the gate electrode 1 (second step). In this step, a volatile operation is performed to the electrical conduction element. The volatile operation represents an operation in which an effect due to application of a voltage is eliminated when stopping application of a voltage.

In addition, the method for operating the electrical conduction element of this embodiment may include a process of applying a voltage to the gate electrode 1 after the first step so as to allow the bandgap of the graphene-based material layer to vary again in a nonvolatile manner (third step). The first to third steps may be performed a plurality of times, or may be combined by changing the sequence thereof.

Hereinafter, the invention will be described in detail with reference to Example. However, it should be understood that the invention is not limited to the following Example, and is defined only by claims.

EXAMPLE

Figure 3:
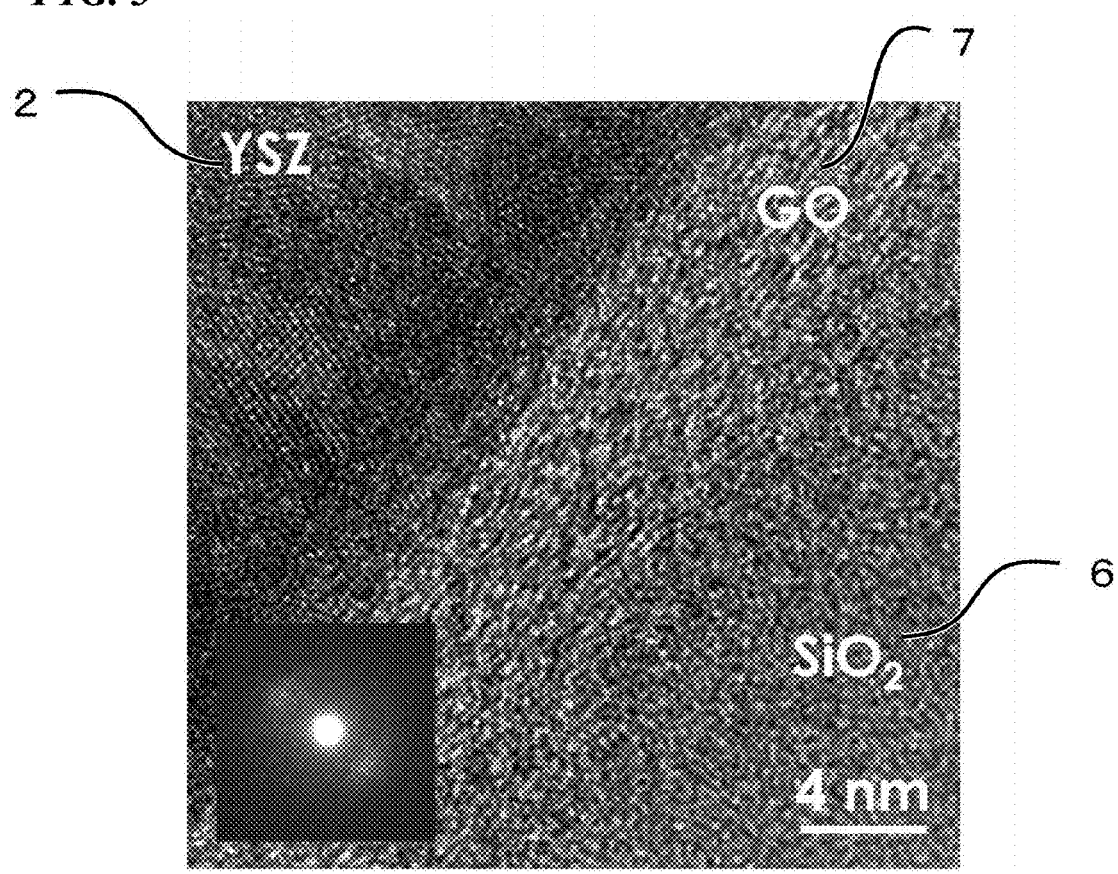
FIG. 3 is a diagram illustrating a transmission electron microscope photograph of an interface between the graphene oxide (GO) coated on a silicon oxide ($SiO_2$) substrate and an yttrium-stabilized zirconia (YSZ) that includes hydrogen ion in an element of Example of the invention.

A three-terminal type element, of which a structure is conceptually illustrated in FIG. 1A, was prepared, and a variation in electrical conductivity between the drain electrode 2 and the source electrode 3 when applying a voltage to the gate electrode 1 was measured. Here, the source electrode 3 was grounded. In the element, Pt was used as the gate electrode 1, the drain electrode 2, and the source electrode 3, and yttrium-stabilized zirconia ($Zr_{1-x}Y_xO_{2-x/2}$ ($0<x\leq0.2$)), which is a hydrogen ion conductor, was used as the ion conductor 5. In addition, as the buffer layer 4, a tantalum oxide ($Ta_2O_5$) layer was interposed between the drain electrode 2 and the source electrode 3, and the ion conductor 5 so as to block electron conduction therebetween. The element was prepared by laminating graphene oxide, Pt, $Ta_2O_5$, $Zr_{1-x}Y_xO_{2-x/2}$, and Pt on a silicon oxide ($SiO_2$) substrate in this order by using an RF sputtering method, a pulse laser deposition (PLD) method, and a spin coating method, which are known, so as to obtain the three-terminal element structure illustrated in FIG. 1A. In the composition of the $Zr_{1-x}Y_xO_{2-x/2}$ film as the ion conductor 5, x was 0.1, and the thickness of the film was 700 nm. The amount (oxygen/(oxygen+carbon)) of oxygen contained in the graphene oxide was 21%. FIG. 3 illustrates a transmission electron microscope photograph in the vicinity of an interface between $Zr_{1-x}Y_xO_{2-x/2}$, graphene oxide, and $SiO_2$ in the element that was prepared. The $Zr_{1-x}Y_xO_{2-x/2}$ (YSZ in the drawing) film, the graphene oxide (GO in the drawing) film, and an interface therebetween had a dense structure without pores, and had high mechanical strength. In addition, the graphene oxide had a thickness of approximately 4 nm, and had a structure in which single-layered graphene oxide was stacked in approximately 10 to 13 layers. From results of electron beam diffraction in the drawing, an interlayer distance of the graphene oxide was predicted as approximately 3.84 Å.

Figure 4:
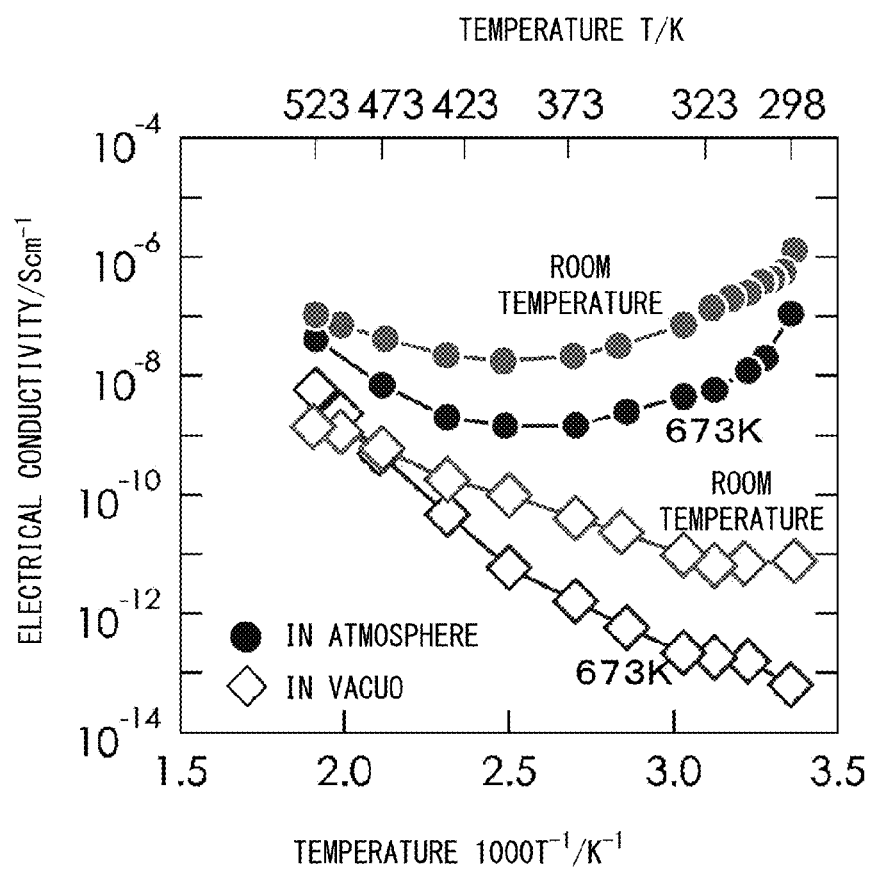
FIG. 4 is a diagram illustrating a relationship between ion conductivity of the yttrium-stabilized zirconia prepared under various conditions, and a temperature in the element of Example of the invention.

FIG. 4 illustrates a relationship between oxygen ion conductivity, which was measured by an AC impedance method, of the $Zr_{1-x}Y_xO_{2-x/2}$ film prepared by the PLD method, and a temperature. In addition, the oxygen ion conductivity is written as "electrical conductivity" on the vertical axis of FIG. 4. The $Zr_{1-x}Y_xO_{2-x/2}$ film was prepared under two conditions of room temperature and 673 K, and measurement of impedance was performed under two conditions including a condition in the atmosphere and a condition in vacuo in a temperature range of 298 K (room temperature) to 523 K. A temperature during preparation of the film is illustrated in the vicinity of a line in the graph of FIG. 4. Ion conductivity exhibited the greatest value in a case of being measured with respect to a film which was prepared at room temperature in the atmosphere in the vicinity of room temperature (298 K), and exhibited the smallest value in a case of being measured with respect to a film which was prepared at 673 K in vacuo in the vicinity of room temperature.

Figure 5:
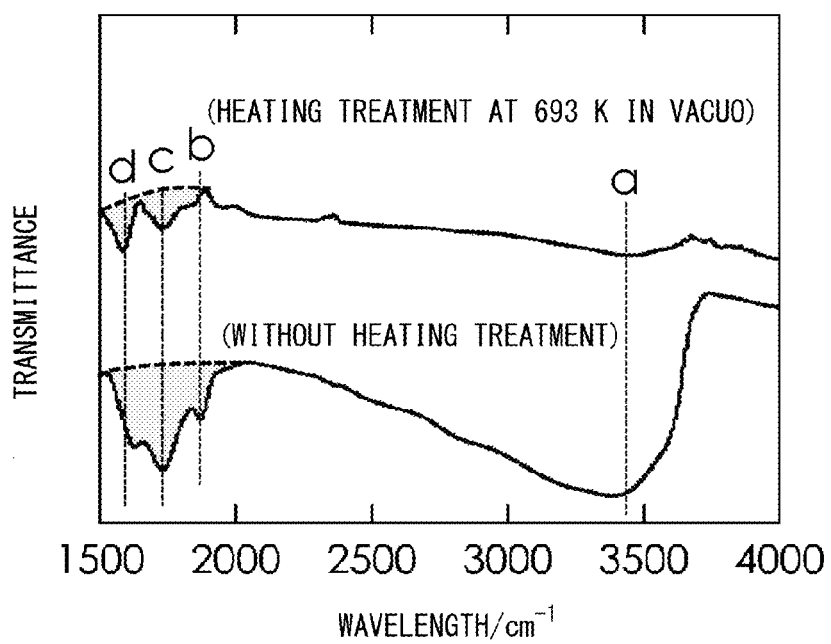
FIG. 5 is a Fourier transformation type infrared spectroscopy optical spectrum in a part of the element of Example of the invention.

FIG. 5 illustrates an optical absorption spectrum in a Fourier transformation type infrared spectroscopy with respect to the $Zr_{1-x}Y_xO_{2-x/2}$ film prepared at room temperature by using the PLD method, and the $Zr_{1-x}Y_xO_{2-x/2}$ film after being subjected to a heat treatment at 693 K in vacuo. In the absorption spectrum before the heat treatment, an absorption peak (indicated by a) of a hydroxyl group (OH—), an absorption peak (indicated by b) of a nitrogen bond (N=O), an absorption peak (indicated by c) of a carbonyl group, an absorption peak (indicated by d) of water ($H_2O$), and the like were recognized. These peaks became significantly small after the heat treatment at 693 K in vacuo. From the results of the AC impedance measurement and the Fourier transformation type infrared spectroscopy, it was proved that a film exhibiting the highest hydrogen ion conductivity was a film which was prepared at room temperature by using the PLD method, and was kept at room temperature in the atmosphere. In addition, when a film was retained in vacuo or at a high temperature, it was proved that grain growth and release of a hydrogen ion that was present at a grain boundary occurred, and hydrogen ion conductivity was lowered. In addition, through additional measurement, it was proved that in a high-temperature region of 523 K or higher, ion conduction species in the $Zr_{1-x}Y_xO_{2-x/2}$ film was changed from a hydrogen ion to an oxygen ion. On the basis of the results, in this example, the $Zr_{1-x}Y_xO_{2-x/2}$ film which was prepared at room temperature by using the PLD method was used as an ion conductor material for a hydrogen ion in the three-terminal element.

Figure 6A:
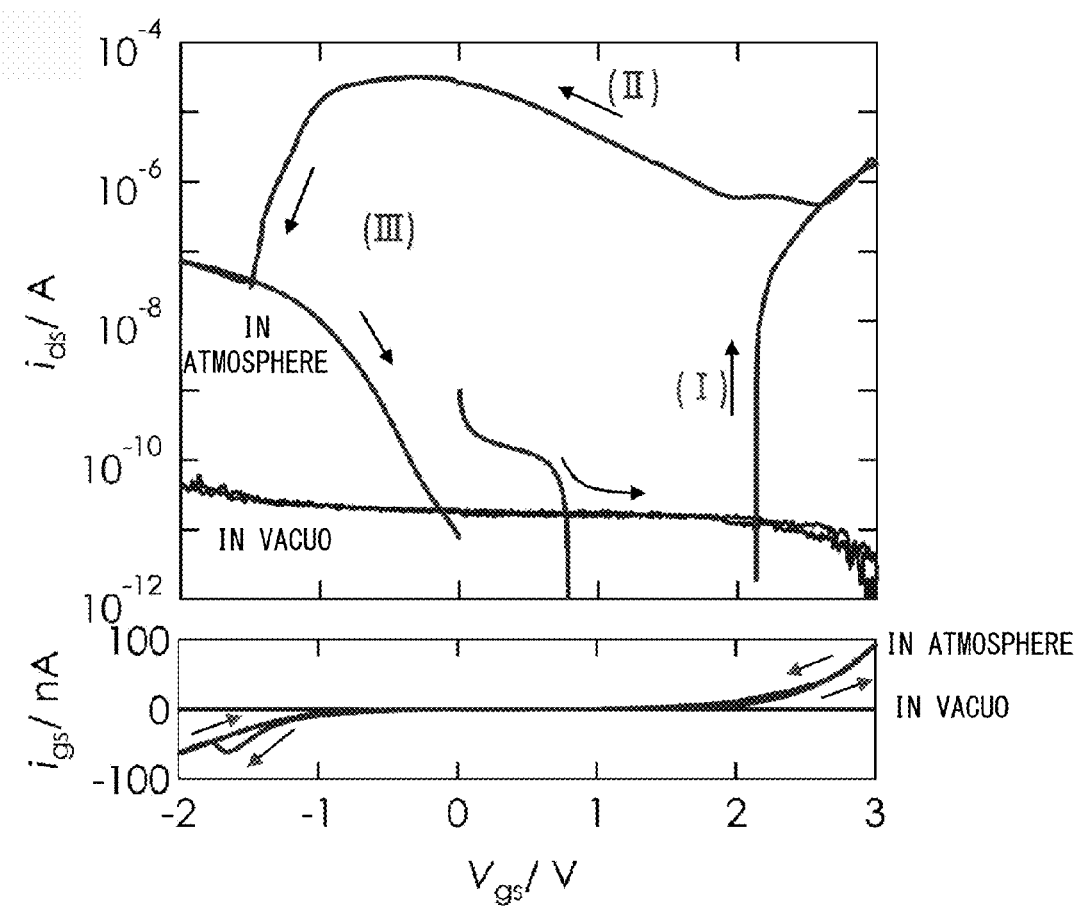
FIG. 6A is a diagram illustrating a relationship (upper graph) between a gate voltage and a current between a drain and a source, and a relationship (lower graph) between the gate voltage and a current between a gate and the source in the element of Example of the invention.

Next, an upper graph and a lower graph in FIG. 6A respectively illustrate a current ($i_{ds}$) between the drain electrode 2 and the source electrode 3, and a current ($i_{gs}$) between the gate electrode 1 and the source electrode 3 during application of a voltage ($V_{gs}$) between the gate electrode 1 and the source electrode 3. In the measurement, a voltage of $V_{ds}$ of 0.5 V was applied between the drain electrode 2 and the source electrode 3, and a measurement temperature was set to room temperature. In a case of measurement in a vacuum atmosphere, even when $V_{gs}$ was swept from 0 V to 3 V, from 3 V to −2 V, and −2 V to 0 V, $i_{ds}$ and $i_{gs}$ were a minute current in the order of a pico-ampere and hardly varied. On the other hand, in a case of measurement in the atmosphere, when increasing $V_{gs}$ from 0 V, $i_{ds}$ was a minute current in the order of pico-ampere up to the vicinity of 2 V, and $i_{ds}$ exhibited a decrement tendency in this range. On the other hand, $i_{gs}$ was a minute current of a pico-ampere or less. In a range of $V_{gs}$ from the vicinity of 2.1 V to 3 V, $i_{ds}$ rapidly increased from the order of pico-ampere to the order of micro-ampere, and $i_{gs}$ also increased from the order of pico-ampere or less to the order of micro-ampere. Next, when $V_{gs}$ was decreased from 3 V to −0.5 V, $i_{ds}$ increased by approximately one digit in accordance with the increase, and $i_{gs}$ decreased from the order of micro-ampere to the order of pico-ampere or less. In addition, when $V_{gs}$ was decreased up to −2 V, $i_{ds}$ rapidly decreased from the order of micro-ampere to the order of nano-ampere, and $i_{gs}$ increased from the order of pico-ampere or less to the order of nano-ampere. In addition, as $V_{gs}$ increased from −2 V to 0 V, $i_{ds}$ further decreased from the order of nano-ampere to the order of pico-ampere, and $i_{gs}$ also decreased from the order of nano-ampere to the order of pico-ampere or less.

Figure 6B:
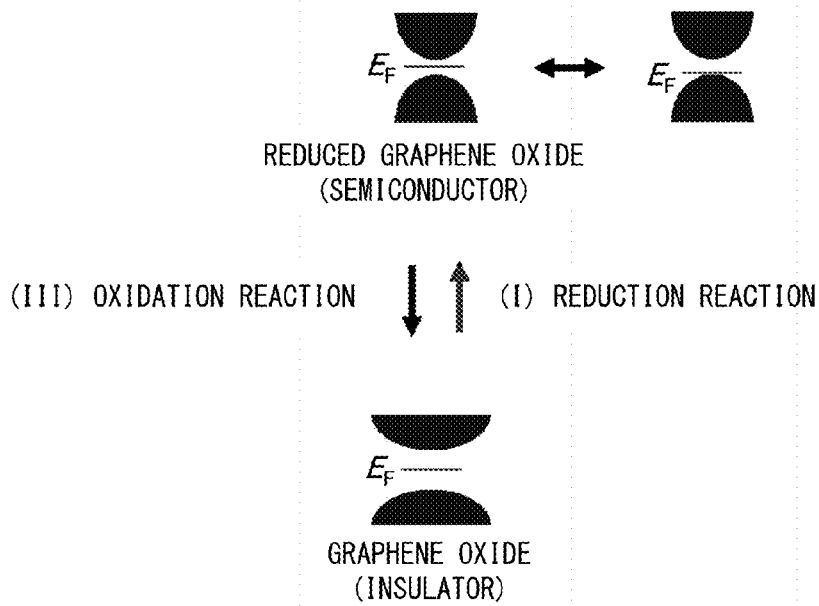
FIG. 6B is a diagram illustrating the principle in which a bandgap of the graphene oxide varies in accordance with application of the gate voltage.

The cause of the variation in $i_{ds}$ and $i_{gs}$ in accordance with the sweeping of $V_{gs}$ will be described with reference to FIG. 6B. During measurement in the atmosphere, when $V_{gs}$ varies from 0 V to the vicinity of 2 V, the hydrogen ion 8 in the ion conductor 5 migrates toward the interface on the graphene oxide side, and forms an electrical double layer. A variation in a carrier concentration occurs due to an electrostatic effect of the electrical double layer, and as a result, $i_{ds}$ decreases. When $V_{gs}$ varies from the vicinity of 2.1 V to 3 V, an electrochemical reaction ($2H^+ + O^{2-} \rightarrow H_2O$) occurs between the hydrogen ion 8 in the ion conductor 5 and the oxygen atom 9 contained in the graphene oxide 6 at the interface on the graphene oxide side, and thus the oxygen atom 9 is released from the graphene oxide 6. Graphene oxide that contains a lot of oxygen atoms has a large bandgap, and has a property of a semiconductor through which electricity is hardly transmitted. When the oxygen atoms contained in the graphene oxide are released through a reduction reaction, the bandgap gradually decreases. As a result, graphene in which the bandgap finally disappears and which exhibits large electrical conductivity is obtained (NPL 4). From this viewpoint, even in this element, the oxygen atoms are released through the electrochemical reaction (reduction reaction of the graphene oxide) at $V_{gs}$ in the vicinity of 2.1 V. As a result, a decrease in bandgap of the graphene oxide occurs, and electrical conductivity increases, and thus $i_{ds}$ significantly increases. In addition, the increase in $i_{gs}$ results from a Faraday current in accordance with the electrochemical reaction. This region is indicated by (I) in FIG. 6A and FIG. 6B.

Next, as $V_{gs}$ decreased from 3 V to −0.5 V, $i_{ds}$ increased by approximately one digit, and $i_{gs}$ decreased from the order of micro-ampere to the order of pico-ampere or less. The reason for the decrease is because an electrical double layer is generated at the interface on the graphene oxide side in accordance with migration of the hydrogen ion 8 in the ion conductor 5, and a variation in carrier concentration occurs due to an effect of the electrical double layer. This region is indicated by (II) in FIG. 6A and FIG. 6B.

In addition, as $V_{gs}$ decreases to −2 V, $i_{ds}$ rapidly decreases from the order of micro-ampere to the order of nano-ampere, and $i_{gs}$ increases from the order of pico-ampere or less to the order of nano-ampere. Here, an electrochemical reaction ($2H^+ + O^{2-} \rightarrow H_2O$) of water contained in the ion conductor 5 occurs at the interface on the graphene oxide side, and negative-polarity oxygen ions that are generated is applied to the graphene oxide 6. At this time, positive-polarity hydrogen ions are distant from the interface on the graphene oxide side. Due to the application of the oxygen atoms, the bandgap of the graphene oxide increases, and thus the graphene oxide has a property of a semiconductor through which electricity is hardly transmitted. As a result, $i_{ds}$ significantly decreases. In addition, the increase in $i_{gs}$ results from a Faraday current in accordance with the electrochemical reaction (oxidation reaction of the graphene oxide). This region is indicated by (III) in FIG. 6A and FIG. 6B.

In addition, as $V_{gs}$ increases from −2 V to 0 V, $i_{ds}$ further decreased from the order of nano-ampere to the order of pico-ampere, and $i_{gs}$ also decreased from the order of nano-ampere to the order of pico-ampere or less. This decrease occurs in correspondence with a variation in the carrier concentration due to the electrical double layer that is generated in accordance with migration of the hydrogen ion 8 in the ion conductor 5 at the interface on the graphene oxide side. In addition, even in the same three-terminal element, $i_{ds}$ and $i_{gs}$ hardly varied in measurement in vacuo even though $V_{gs}$ varied. The reason for this is because the hydrogen ions in the ion conductor and water are released in vacuo, and thus hydrogen ion conduction does not occur. As a result, a redox reaction related to the oxygen atoms in the graphene oxide does not occur.

Figure 7:
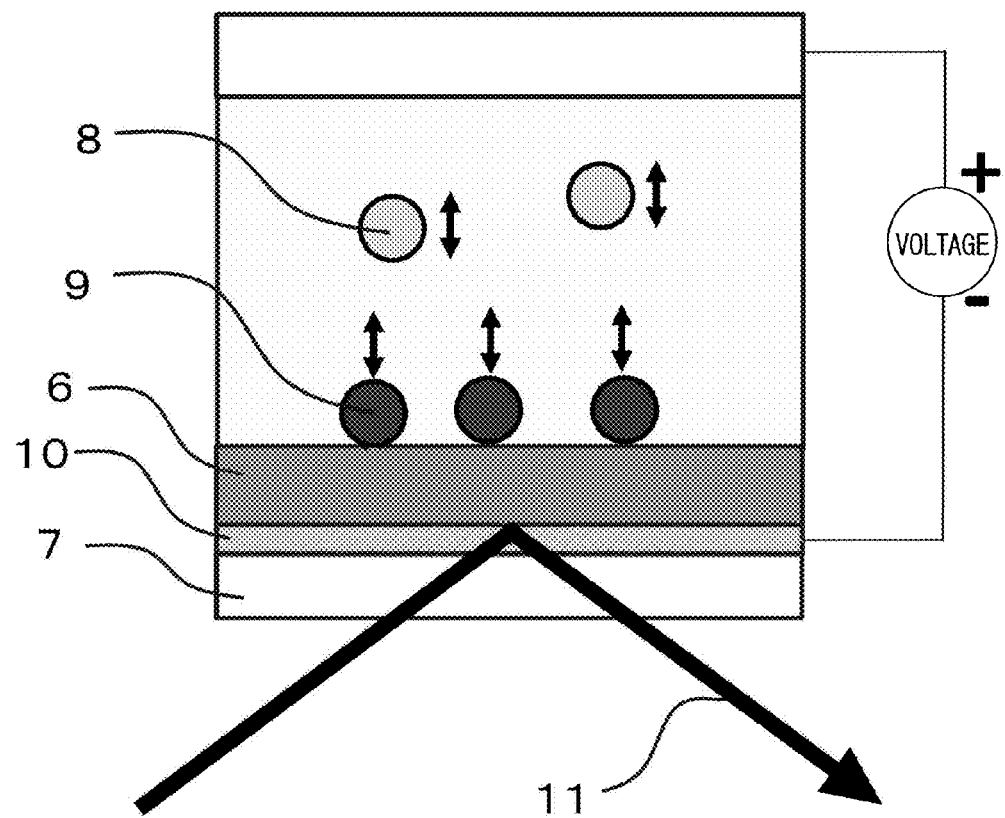
FIG. 7 is a conceptual diagram of a two-terminal type element, the conceptual diagram being drawn to investigate optical characteristics of the graphene oxide or the graphene in the element of Example of the invention.

A variation manner of the bandgap due to the release or the application of the oxygen atoms contained in the graphene oxide were investigated. FIG. 7 illustrates an optical measurement method for predicting the bandgap from a diffuse reflectance spectrum of the graphene oxide. As a measurement sample, a stacked body which was obtained by stacking an indium tin oxide (ITO) film as a transparent electrode 10 (ITO) having excellent electrical conductivity, the graphene oxide (GO) 6, yttrium-stabilized zirconia ($Zr_{1-x}Y_xO_{2-x/2}$) as an ion conductor of a hydrogen ion, and the gate electrode 1 on the transparent silicon oxide substrate 7 in this order was used. At this time, a value of x in the stabilized zirconia was 0.1, and the amount of oxygen contained in the graphene oxide was set 21%. A diffuse reflection spectrum was measured by using an ultraviolet ray, visible ray, and infrared ray spectrophotometer while allowing light in a wide range of wavelength to be incident to the sample from the bottom surface of the silicon oxide substrate.

Figure 8:
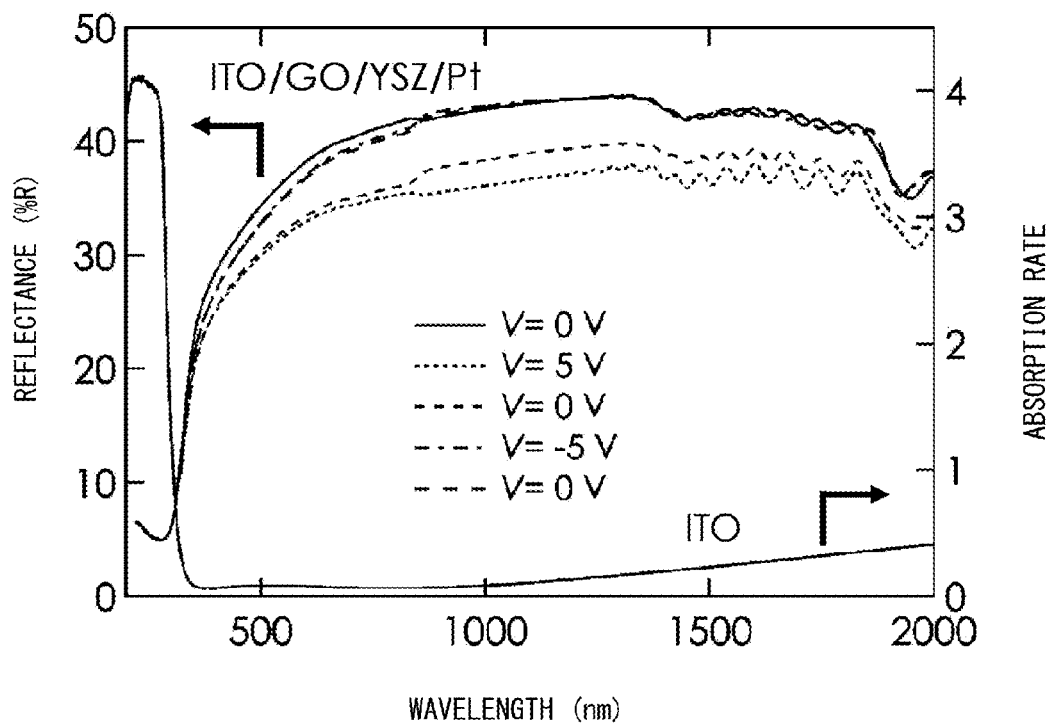
FIG. 8 is a diffuse reflectance spectrum in the element of Example of the invention.

FIG. 8 illustrates a diffuse reflection spectrum that was measured while applying a voltage between the transparent electrode 10 and the gate electrode 1 in the sample in the order of 0 V→5 V→0 V→5 V→0 V. At this time, the gate electrode 1 was grounded. In addition, an absorption spectrum of only the ITO film was also measured for comparison. In the measurement range, optical absorption of the silicon oxide substrate 7 was slight, and thus the optical absorption was neglected. From the spectrum results, it could be seen that a reflectance of the graphene oxide varied in accordance with voltage application. However, in spectrum display, an absorption edge of the graphene oxide in the vicinity of 200 nm overlaps with an absorption edge of the ITO film, and is not clear, and thus it is difficult to predict the bandgap.

Figure 9:
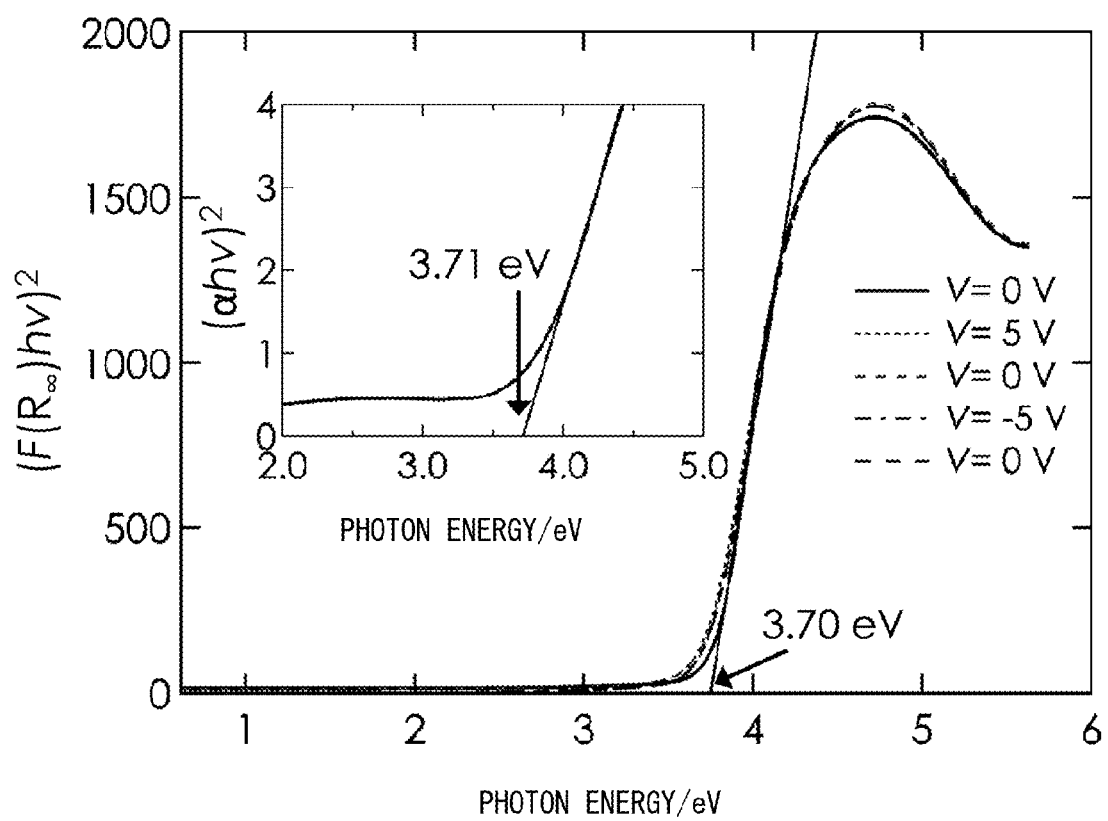
FIG. 9 is a diagram illustrating a measurement result of FIG. 8 with direct allowed transition type Tauc plots.

FIG. 9 is a view in which the vicinity of the absorption edges is indicated with Tauc plots. Here, the bandgap was estimated by subjecting an absorption coefficient to Kubelka-Munk conversion, and applying the resultant value to a relational expression of $(F(R\infty)hv)^{1/n} = A(hv - E_g)$ (NPL 6). Respective symbols in the relational expression are as follows. $F(R\infty)$ represents an amount proportional to an optical absorption coefficient, h represents Planck's constant, v represents the number of vibrations, $E_g$ represents a bandgap, and A represents a proportional constant. From results in FIG. 9, it is possible to predict the bandgap of ITO. In this case, the vertical axis was set as $(F(R\infty)hv)^2$ when considering that in ITO, a process in which a photon is excited from a valence band of an electron to a conductor is direct transition. In addition, a small graph in the drawing represents a result of only the ITO film. From inclination of collinear approximation, the bandgap of the sample to which respective voltages were applied was predicted as 3.70 eV, and the bandgap of the sample composed of only the ITO film was predicted as 3.71 eV. The bandgap values were equal to a bandgap of an ITO crystal which has been reported (NPL 7).

Figure 10:
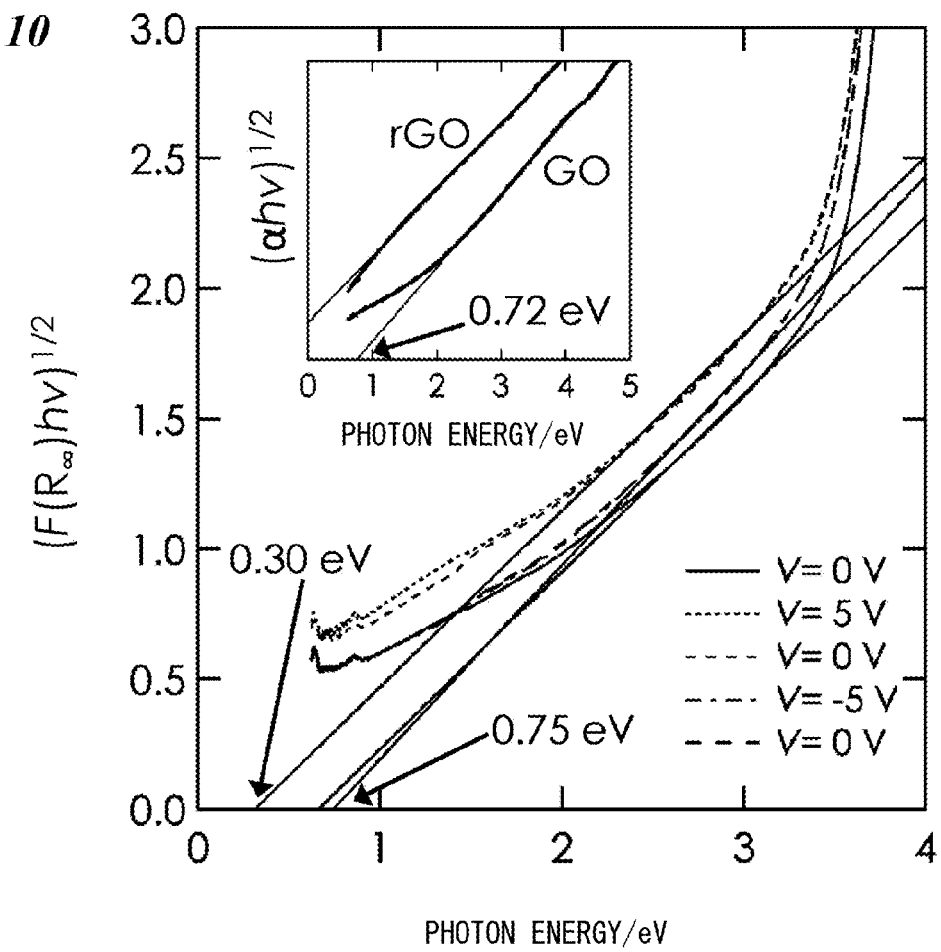
FIG. 10 is a diagram illustrating the measurement result of FIG. 8 with indirect allowed transition type Tauc plots.

Next, a bandgap of the graphene oxide was estimated from detailed fitting of absorption edges as illustrated in FIG. 10. Here, the vertical axis was set as $(F(R\infty)hv)^{1/2}$ when considering that optical excitation of an electron in the graphene oxide is indirect transition. As a voltage between the transparent electrode 10 and the gate electrode 1 varied in the order of 0 V→5 V→0 V→5 V→0 V, a value of the bandgap also varied from 0.75 V to 0.30 V. In addition, analysis results for graphene oxide (GO) prepared at room temperature by using PLD, and graphene (rGO) prepared by subjecting the graphene oxide to a heat treatment in a reduction atmosphere in order for an oxygen atom to be released are also illustrated as a small graph in the drawing. The bandgap of the graphene oxide (GO) was 0.72 V, and was satisfactorily equal to a value in a state (0 V) in which a voltage was not applied to the transparent electrode 10 and the gate electrode 1. In addition, the bandgap of the graphene (rGO) obtained by reducing the graphene oxide was 0 or less, and a property of graphene with no bandgap was exhibited.

Figure 11:
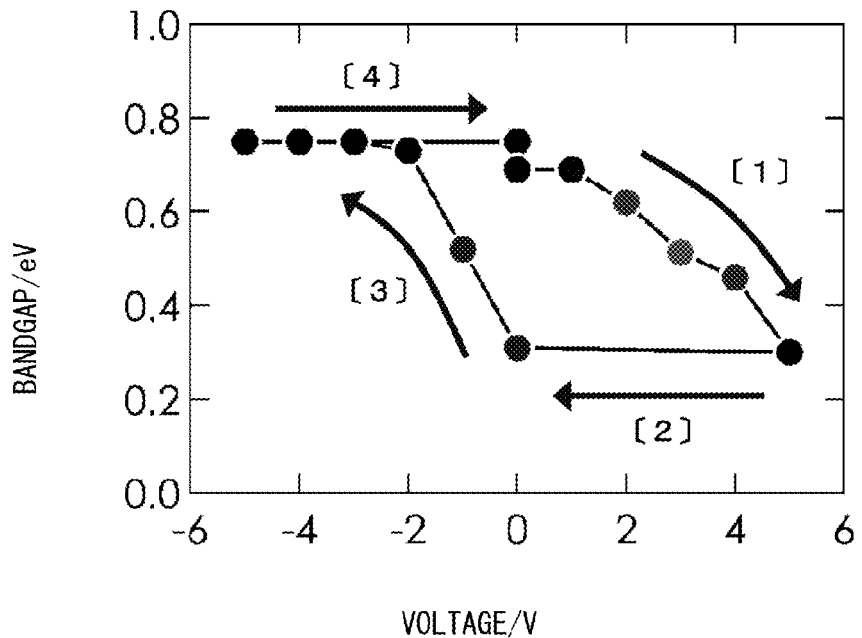
FIG. 11 is a diagram illustrating a relationship between an application voltage and a bandgap in the element of Example of the invention.

FIG. 11 illustrates the magnitude of the bandgap of the graphene oxide which varies in accordance with voltage application between the indium tin oxide film 10 and the gate electrode I in the order of 0 V→5 V→0 V→5 V→0 V. In a region from 0 V to 5 V which is indicated by [1], the bandgap gradually decreases in accordance with an increase in a voltage from the vicinity of 2 V. The reason for this is because the electrochemical reaction ($2H^++O^{2-}$ $H_2O$) occurs between the hydrogen ion 8 in the ion conductor 5 and the oxygen atom 9 applied to the graphene oxide 6 at the interface on the graphene oxide side, and the oxygen atom 9 is released from the graphene oxide 6. The bandgap decreases from 0.75 eV to 0.30 eV due to the release of the oxygen atom. Next, in a region from 5 V to 0 V which is indicated by [2], the electrochemical reaction does not occur, and the amount of oxygen contained in the graphene oxide does not vary, and thus the bandgap does not vary. In a region from 0 V to −5 V which is indicated by [3], the electrochemical reaction ($2H^++O^{2-}$←$H_2O$) occurs, and the oxygen atom 9 is applied to the graphene oxide 6. The bandgap increases from 0.30 eV to 0.75 eV due to the increase in the amount of oxygen contained in the graphene oxide. It is possible to reversibly perform control of the magnitude of the bandgap when considering that it is possible to reversibly perform the release and the application of the oxygen atoms from and to the graphene oxide through the voltage application. In addition, the oxygen atoms contained in the graphene oxide stably exists, and thus the magnitude of the bandgap that is controlled is stable, and is nonvolatile.

Figure 12A:
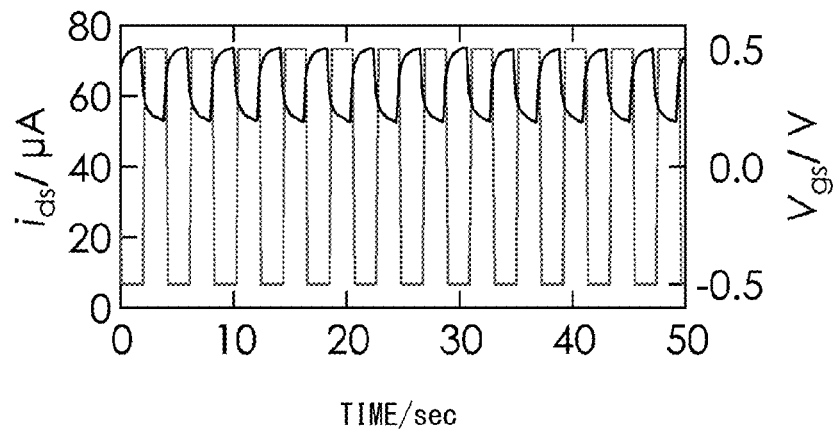
FIG. 12A is a diagram illustrating a switching current that flows between a source electrode and a drain electrode when a voltage of 0.5 V and a voltage of −0.5 V are alternately applied to a gate electrode of the element of Example of the invention after a voltage of 2.5 V is applied to the gate electrode.
Figure 12B:
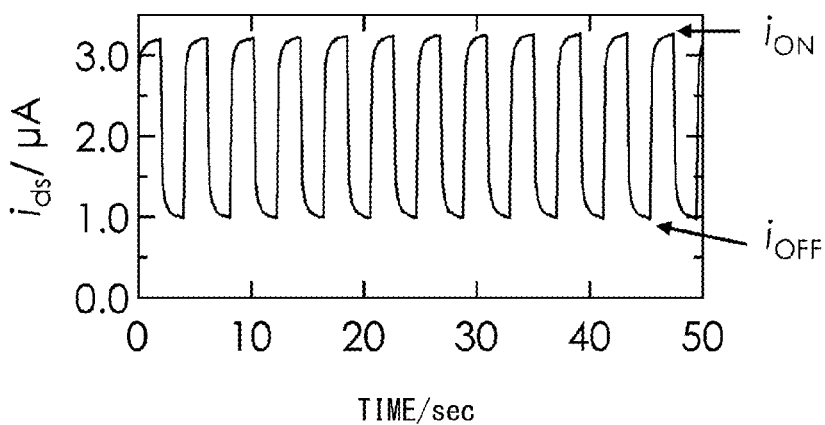
FIG. 12B is a diagram illustrating a switching current that flows between the source electrode and the drain electrode when a voltage of 0.5 V and a voltage of 0.5 V are alternately applied to the gate electrode of the element of Example of the invention after a voltage of 2.3 V is applied to the gate electrode.
Figure 12C:
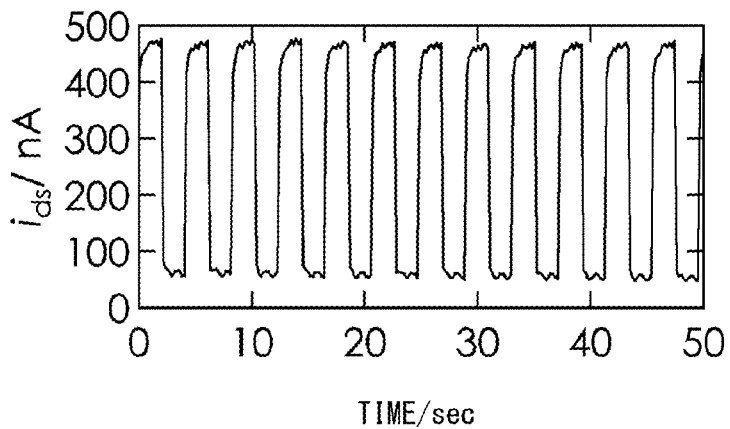
FIG. 12C is a diagram illustrating a switching current that flows between the source electrode and the drain electrode when a voltage of 0.5 V and a voltage of −0.5 V are alternately applied to the gate electrode of the element of Example of the invention after a voltage of −1.0 V is applied to the gate electrode.

After controlling the bandgap by applying a relatively great voltage between the gate electrode and the source electrode, a positive-polarity voltage and a negative-polarity voltage, which are small in a degree at which a variation in the bandgap does not occur, were alternately applied to investigate a switching current flowing between the drain electrode and the source electrode. After constructing the three-terminal element illustrated in FIG. 2, first, $V_{gs}$ was swept from 0 V to 2.3 V, thereby forming the above-described bandgap. The bandgap at this time was estimated as approximately 0.6 eV when considering the optical measurement results in FIG. 11. In this state, as $V_{gs}$ at which the bandgap hardly varies, a voltage of 0.5 V and a voltage of −0.5 V were alternately applied, a large current and a small current were alternately exhibited in $i_{ds}$ (indicated by a dark-colored line in FIGS. 12A to 12C). That is, switching currents in an ON state and an OFF state were obtained (FIG. I 2B). Next, $V_{gs}$ was increased from 2.3 V to 2.5 V, and retention was performed for 1000 seconds so as to slightly decrease the bandgap. A bandgap at this time was estimated as approximately 0.5 eV when considering the optical measurement results in FIG. 11. Similarly, when a voltage of 0.5 V and a voltage of −0.5 V were alternately applied as $V_{gs}$, a switching current was shown in $i_{ds}$ (FIG. 12A). In addition, a negative-polarity voltage was applied by changing $V_{gs}$ from 2.5 V to −1.0 V. A bandgap at this time was estimated as approximately 0.7 eV. Similarly, when a voltage of 0.5 V and a voltage of −0.5 V were alternately applied as $V_{gs}$, a switching current was shown in $i_{ds}$ (FIG. 12C). Satisfactory switching characteristics were obtained in all voltage conditions (FIG. 12A, FIG. 12B, and FIG. 12C) in the gate electrode to which a voltage was applied. However, the magnitude of a current flowing during switching was dependent on the magnitude of a voltage that was previously applied between the gate electrode and the source electrode, that is, the magnitude of the bandgap that was formed. In addition, the above-described alternate application of 0.5 V and −0.5 V as $V_{gs}$ is indicated by a light-colored line in FIG. 12A. In addition, alternate application of the same $V_{gs}$ was also performed in measurement illustrated in graphs of FIG. 12B and FIG. 12C, and plots of $V_{gs}$ were omitted in the graphs.

Here, in a case where all voltages which are applied to a circuit during application of $V_{gs}$ in a range in which the bandgap hardly varies are set to zero (that is, power is cut off), and then application of the same voltage is performed again (that is, a power supply is provided again), the bandgap of the element of this embodiment in the circuit retains a value that is set immediately previously, but an effect of $V_{gs}$ at the time of cutting off the power or other effects of the application voltage do not remain. From this viewpoint, it is possible to allow the element of this embodiment to perform a volatile operation in a state in which the bandgap is set in a nonvolatile manner. In addition, it is possible to perform control of dynamic operation conditions in which the bandgap is reset by applying $V_{gs}$ in a range capable of allowing the bandgap to vary, and a volatile operation is allowed to be performed under conditions different from conditions before the resetting.

As described above, the element of this embodiment can be allowed to perform an element operation such as switching in a volatile manner after setting the bandgap of the graphene oxide or graphene which is used in a dynamic and nonvolatile manner.

According to the invention, it is possible to control the amount of oxygen atoms contained in the graphene oxide or graphene by allowing an electrochemical reaction to occur on a surface of the graphene oxide or graphene by using local migration of the hydrogen ion or the oxygen ion. In addition, it is possible to provide an electrical element in which the bandgap of the graphene oxide or graphene, and the electrical resistance are variable through control of the amount of oxygen contained. The variable electrical conduction element is applicable to a switch element, a memory element, and the like, and is expected to be widely used in industrial fields.

REFERENEC SIGNS LIST

1: Gate electrode
2: Drain electrode
3: Source electrode
4: Buffer layer
5: Hydrogen ion or oxygen ion conductor
6: Graphene oxide or graphene
7: Insulating substrate
8: Hydrogen ion or oxygen ion
9: Oxygen atom that is contained in graphene oxide
11: Incident light and reflected light

The invention claimed is:

1. An electrical conduction element, comprising:
   an ion conductor material layer including an ion conductor capable of conducting a hydrogen ion or an oxygen ion;
   a gate electrode layer and a graphene-based material layer between which the ion conductor material layer is interposed, the graphene-based material layer including graphene oxide or graphene which is laminated on an insulating substrate; and
   a drain electrode layer and a source electrode layer which are provided on a surface of the graphene-based material layer or in the interlayer position of the graphene-based material layer, or on the insulating substrate.

2. The electrical conduction element according to claim 1, wherein a buffer layer is provided between the drain electrode layer and the ion conductor material layer and between the source electrode layer and the ion conductor material layer.

3. The electrical conduction element according to claim 1, further comprising:

means that applies a voltage between the gate electrode layer and the source electrode layer or between the gate electrode layer and the drain electrode layer, wherein the electrical conduction element is arranged so that a hydrogen ion or an oxygen ion in the ion conductor material layer migrates due to the application of a voltage by the means to cause an electrochemical reaction to occur at an interface between the graphene-based material layer and the ion conductor material layer, allowing the oxygen atom to be released from the graphene-based material layer or allowing the oxygen atom to be provided to the graphene-based material layer.

4. The electrical conduction element according to claim 3, wherein the electrical conduction element is arranged so that a magnitude of a bandgap that is an electron state of the graphene-based material layer varies due to the release or provision of the oxygen atom in accordance with the electrochemical reaction, which causes conductivity between the drain electrode and the source electrode to vary.

5. The electrical conduction element according to claim 1, wherein the ion conductor material contains a metal oxide or a polymer compound which has a hydrogen ion.

6. The electrical conduction element according to claim 5, wherein the metal oxide is at least one selected from the group consisting of yttrium-stabilized zirconia ($Zr_{1-x}Y_xO_{2-x/2}(0<x\leq0.2)$) and $BaZr_{0.8}Y_{0.2}O_{3-x}(0<x\leq0.2)$.

7. The electrical conduction element according to claim 5, wherein the polymer compound is a polymer ion-exchange membrane of a vinyl fluoride-based polymer bound with a complex containing perfluoro sulfonic acid.

8. The electrical conduction element according to claim 1, wherein the ion conductor material includes a metal oxide having an oxygen ion.

9. The electrical conduction element according to claim 7, wherein the metal oxide is at least one selected from the group consisting of gadolinium-doped ceria ($Ce_{1-x}Gd_xO_{2-x/2}(0<x\leq0.5)$) having an oxygen ion, stabilized zirconia, stabilized bismuth oxide, tungsten oxide, zinc oxide, and tin oxide.

10. The electrical conduction element according to claim 1, wherein the gate electrode, the source electrode, and the drain electrode respectively contain at least one selected from the group consisting of platinum, palladium, rhodium, and ruthenium.

11. The electrical conduction element according to claim 2, wherein the buffer layer contains at least one selected from the group consisting of tantalum oxide, aluminum oxide, hafnium oxide, and zirconium oxide.

12. The electrical conduction element according to claim 1, wherein a material of the insulator or semiconductor includes at least one selected from the group consisting of metal oxides such as strontium titanate, silicon oxide, and aluminum oxide.

13. An electronic device, comprising:
the electrical conduction element according to claim 1.

14. A method for operating an electrical conduction element according to claim 1, the method comprising:
a first step of applying a voltage to the gate electrode layer to allow a bandgap of the graphene-based material layer to vary in a nonvolatile manner; and
a second step of then applying a voltage to the gate electrode layer, the voltage having a range of magnitude that does not vary the bandgap so as to allow the gate electrode layer to perform a volatile operation.

15. The method for operating an electrical conduction element according to claim 14, further comprising after the first step:
a third step of applying a voltage to the gate electrode layer so as to allow the bandgap of the graphene-based material layer to vary again in a nonvolatile manner.

* * * * *